United States Patent
Teva et al.

(10) Patent No.: US 9,054,261 B2
(45) Date of Patent: Jun. 9, 2015

(54) PHOTODIODE DEVICE AND METHOD FOR PRODUCTION THEREOF

(75) Inventors: Jordi Teva, Graz (AT); Franz Schrank, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 13/981,302

(22) PCT Filed: Jan. 24, 2012

(86) PCT No.: PCT/EP2012/051033
§ 371 (c)(1),
(2), (4) Date: Sep. 19, 2013

(87) PCT Pub. No.: WO2012/101116
PCT Pub. Date: Aug. 2, 2012

(65) Prior Publication Data
US 2014/0021572 A1    Jan. 23, 2014

(30) Foreign Application Priority Data

Jan. 25, 2011   (DE) .......................... 10 2011 009 373

(51) Int. Cl.
*H01L 27/14*    (2006.01)
*H01L 31/101*   (2006.01)
*H01L 27/146*   (2006.01)
*H01L 31/0224*  (2006.01)

(52) U.S. Cl.
CPC ......... *H01L 31/101* (2013.01); *H01L 27/14636* (2013.01); *H01L 27/1464* (2013.01); *H01L 27/14689* (2013.01); *H01L 31/022408* (2013.01)

(58) Field of Classification Search
CPC ............ H01L 31/101; H01L 27/14689; H01L 27/14636; H01L 31/022408; H01L 27/1464
USPC .......................... 257/431, 224, 229, 241, 243
See application file for complete search history.

(56) References Cited

U.S. PATENT DOCUMENTS

| | | | |
|---|---|---|---|
| 5,886,374 A * | 3/1999 | Sakamoto et al. ............ | 257/292 |
| 6,229,194 B1 * | 5/2001 | Lizotte ......................... | 257/506 |
| 6,828,644 B2 * | 12/2004 | Asano et al. ................... | 257/461 |
| 7,187,017 B2 * | 3/2007 | Sawase et al. ................. | 257/222 |
| 7,576,404 B2 | 8/2009 | Wilson et al. | |
| 7,655,973 B2 * | 2/2010 | Mouli ........................... | 257/330 |
| 7,898,052 B2 * | 3/2011 | Prantl et al. ................... | 257/446 |
| 2007/0085117 A1 | 4/2007 | Wilson et al. | |
| 2009/0038669 A1 | 2/2009 | Atanackovic | |
| 2010/0108893 A1 | 5/2010 | Flitsch et al. | |
| 2010/0193893 A1 | 8/2010 | Meinhardt et al. | |

FOREIGN PATENT DOCUMENTS

WO    2005001941 A2    1/2005

* cited by examiner

*Primary Examiner* — William D Coleman
(74) *Attorney, Agent, or Firm* — McDermott Will & Emery LLP

(57) ABSTRACT

The photodiode device has an electrically conductive cathode layer (3) at a photodiode layer (4) composed of a semiconductor material. Doped anode regions (5) are situated at a top side of the photodiode layer facing away from the cathode layer. A trench (14) subdivides the photodiode layer. A conductor layer (7) is arranged in or at the trench and electrically conductively connects the cathode layer with a cathode connection (11). Anode connections (12) are electrically conductively connected with the anode regions.

6 Claims, 6 Drawing Sheets

PHOTODIODE DEVICE AND METHOD FOR PRODUCTION THEREOF

The present invention relates to a photodiode device with photodiode arrays, in which the crosstalk between the individual pixels is minimized. These photodiode devices are intended in particular for rear-side light incidence and can be integrated with CMOS circuitry components.

Photodiodes with through-hole contacts in the substrate are described in US 2010/0193893 A1, US 2010/0108893 A1 and U.S. Pat. No. 7,576,404 A, for example.

The problem of the present invention is to specify a photodiode device that can be manufactured easily and has an especially low crosstalk between the pixels. An associated manufacturing method is also to be specified.

This problem is solved with the photodiode device having the features of claim 1. Embodiments and variants derive from the dependent claims.

A trench that divides the photodiode layer into a grid of pixels is provided in the photodiode device. In or on the trench, there is a conductor layer that electrically connects a cathode layer arranged on the underside of the photodiode layer to a cathode terminal arranged on the upper side of the photodiode layer opposite the cathode layer. Anode regions, each enclosed by the trench, are formed on the upper side of the photodiode layer. The anode regions are connected on their upper sides to electrical terminals, hereinafter referred to as anode terminals. The anode terminals and the cathode terminal can be structured portions of a metal layer arranged in a dielectric. An insulation layer and a base substrate, which, together with the photodiode layer, form the structure of an SOI substrate, can be arranged on the side of the cathode layer facing away from the photodiode layer.

In a general embodiment, the photodiode device has an electrically conductive cathode layer on a photodiode layer made of a semiconductor material. Doped anode regions are on an upper side of the photodiode layer facing away from the cathode layer. A trench subdivides the photodiode layer. A conductor layer is arranged in the trench or in the photodiode layer on the side walls of the trench and connects the cathode layer electroconductively with a cathode terminal, which is arranged above the upper side of the photodiode layer. Anode terminals are likewise arranged on the upper side of the photodiode layer and are electroconductively connected with the anode regions.

In embodiments the conductor layer does not completely fill the trench and an electrically conductive trench filling is present in the trench.

In further embodiments the conductor layer does not completely fill the trench and a dielectric trench filling is present in the trench.

In further embodiments the photodiode layer is float-zone silicon. The anode regions are formed by p+ doping.

In further embodiments the trench also subdivides the cathode layer.

In further embodiments the cathode layer is subdivided into strip-like portions.

In further embodiments a plurality of mutually separated cathode terminals are present, and the conductor layer does not fill up the trench, but instead has a plurality of mutually separated portions, each connected to one of the cathode terminals.

In further embodiments a dielectric trench filling is present in the trench between the portions of the conductor layer.

In further embodiments a doped contact area is electrically connected with the conductor layer on the upper side of the photodiode layer. The cathode terminal and the anode terminals are formed in at least one conductor plane in a dielectric. With regard to the conductor plane, vertical conductors connect the cathode terminal with the contact area and the anode terminals with the associated anode regions.

In a method for producing such a photodiode device, an arrangement of an insulation layer, the cathode layer and the photodiode layer is formed and the anode regions and optionally the contact area are formed by introducing dopant on the upper side of the photodiode layer facing away from the cathode layer.

In variants of the method, the cathode layer is formed on the photodiode layer, the cathode layer is connected by means of an insulation layer to a base substrate, a trench reaching at least to the cathode layer is formed in the photodiode layer from an upper side of the photodiode layer facing away from the cathode layer, and a conductor layer in contact with the cathode layer is produced in the trench.

In further variants of the method, the cathode layer is produced on the photodiode layer, a trench is produced in the photodiode layer starting from the cathode layer. a conductor layer in connection with the cathode layer is produced in the trench, and the cathode layer is connected by means of an insulation layer to a base substrate.

In further variants of the method, at least a part of the conductor layer is used as an alignment mark in additional method steps that are performed on or above the upper side of the photodiode layer.

A more detailed description of examples of the photodiode device and the production method will follow, with reference to the figures.

Figure 1:
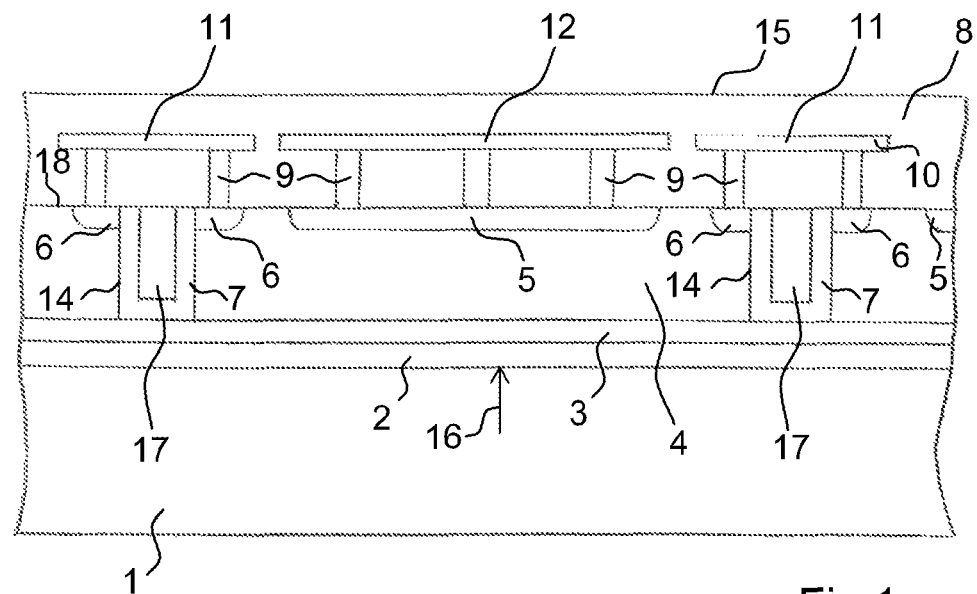
FIG. 1 shows a section of an embodiment of the photodiode device in cross section.

FIG. 1 shows a cross section through an embodiment of the photodiode device. The photodiode layer 4 is a semiconductor material and can be float-zone silicon, a silicon body of high purity produced according to a known method. If float-zone silicon is used for the photodiode layer 4, undesirable dark currents and consequently the background noise are low. That is a substantial advantage compared to devices with an epitaxially-grown photodiode layer. The cathode layer 3 made of electrically conductive material and the anode regions 5, each confined to one image point and formed by introduction of a p-type dopant into the semiconductor material of the photodiode layer 4, are located at opposite main surfaces of the photodiode layer 4. The cathode layer 3 can be a separate layer of electrically conductive material or can be formed by introduction of an re-type dopant into the photodiode material 4. In particular, the cathode layer 3 can be made of SiC and applied as an epitaxial layer to the photodiode layer 4, or can be produced by introduction of carbon into the silicon of the photodiode layer 4.

The photodiode layer 4 can in particular be a fraction of an SOI substrate that is formed by a base substrate 1, which can be provided as a handling wafer for example, an insulation layer 2, made of SiO2 for example, and the photodiode layer 4. The cathode layer 3 and the anode regions 5 are electrically connected on the upper side 18 of the photodiode 4 facing away from the insulation layer 2.

A trench 14, which divides the photodiode layer 4 into an array of pixels, is located in the photodiode layer 4. The trench 14 can have the shape of a double grid, for example, and subdivide the photodiode layer 4 into a rectangular grid of pixels, so that a pixel with the associated anode region 5 is present in each rectangle enclosed by the trench 14. In the present embodiment, a contact area 6 is formed on the upper side 18 of the photodiode layer 4 along the trench 14 by introducing a dopant. The contact area 6 is preferably n-type. A conductor layer 7, which is present at least on the side walls of the trench 14, is located in the trench 14 and contacts the cathode layer 3. In the embodiment of FIG. 1, the conductor layer 7 covers the bottom of the trench 14. The conductor layer 7 need not completely fill up the trench 14. In this case, the trench 14 can be filled with a trench filler 17. The trench filler 17 can be electrically conductive material or a dielectric.

A cathode terminal 11 and anode terminals 12 are formed in the illustrated embodiment in an appropriately structured conductor plane 10, which is arranged in a dielectric 8. Additional conductor planes, which are separated from one another by the dielectric 8, can be provided. Vertical conductors 9 made of a metal connect the cathode terminals 11 with the contact area 6 and the anode terminals 12 with a respective associated anode region 5. The contact area 6 and the anode regions 5 have a high concentration of the respective dopants, so that the vertical conductors 9 have low-resistance contact with the doped regions. The cathode terminal 11 can be structured such that it extends across the trench 14, for example. Instead of that, the cathode terminal 11 can extend over only a part of the trench 14, or it can be laterally offset from the trench 14.

In the embodiment according to FIG. 1, the trench 14 subdivides the photodiode layer 4 completely. Areas of the outer side of the conductor layer 7 facing the photodiode layer 4 are electroconductively connected to the contact area 6. It is expedient if the vertical conductors 9 are present on the portions of the contact area 6 on either side of the trench 14. Instead of that, the vertical conductors 9 can also be arranged differently, on only one side of the trench 14, for example.

The side of the dielectric 8 facing away from the photodiode layer 4 can be provided as a bonding surface 15. In a vertical integration or a 3-D integration, another semiconductor substrate can be arranged there, in which an electronic circuit, in particular a CMOS circuit, is integrated. The base substrate 1 is provided in particular as a handling wafer and can preferably be removed, or at least ground back.

The light-incidence side, on the underside in illustration of FIG. 1, is provided for light to enter in the incidence direction 16 indicated by the arrow. If the base substrate 1 is removed, the external light incidence side can be formed by the lower side of the insulation layer 2. Together with a circuit arranged on the bonding surface 15, the photodiode component forms a photodiode array for rear-side light incidence. The subdivision of the photodiode layer 4 into the individual pixels by means of the trench 14 and the conductor layer 7 arranged therein has the advantage in particular that the crosstalk between the pixels is very low, typically in the range of 0.1% or below. In preferred embodiments, the crosstalk can be 0.01% or less. That is a considerable improvement compared to conventional photodiode arrays, in which the crosstalk between the pixels is typically about 0.4%.

The trench 14 has the advantage that the distance between the pixels is very low, so that a particularly large proportion of the component surface area can be used for capturing images. It is also possible in this way to provide a larger number of smaller pixels, whereby the resolution of the photodiode array is especially high. The low electrical supply resistance that results from the connection of the cathode layer 3 via the conductor layer 7 is advantageous for high-frequency applications.

Figure 2:
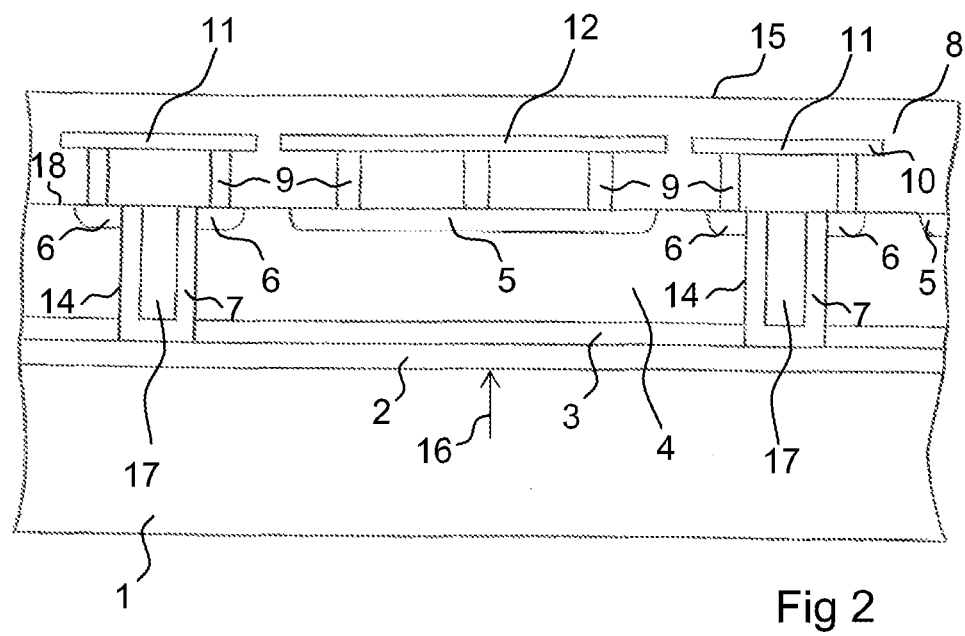
FIG. 2 shows a cross section according to FIG. 1 following an additional embodiment in which the trench subdivides the cathode layer.

FIG. 2 shows a cross section according to FIG. 1 through a further embodiment, in which the same reference numbers as in FIG. 1 are used for the corresponding components. In the embodiment of FIG. 2, the trench 14 subdivides not only the photodiode layer 4, but also the cathode layer 3 completely, down to the insulation layer 2. Instead of this, the trench 14 can extend into the cathode layer 3 without completely subdividing the cathode layer 3. In this case, the trench 14 is deeper than in the embodiment of FIG. 1, as measured from the upper side 18, and shallower than in the embodiment of FIG. 2.

Figure 3:
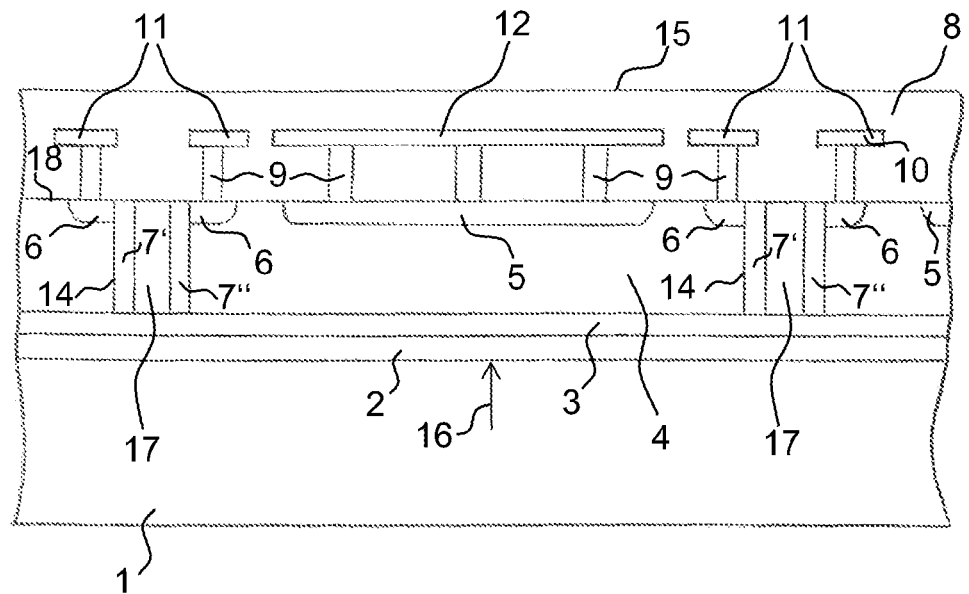
FIG. 3 shows a cross section according to FIG. 1 following an additional embodiment in which the conductor layer in the trench has a plurality of portions mutually separated from one another.

FIG. 3 shows a cross section according to FIG. 1 through a further embodiment, in which the conductor layer has portions 7', 7" that are separated from one another and have mutually separated cathode terminals 11. The contact area 6 is correspondingly subdivided. This embodiment can be produced by first producing the conductor layer 7 according to FIG. 1 and then removing the part of the conductor layer 7 on the bottom of the trench 14. The separated portions 7', 7" of the conductor layer each surround a pixel of the array. In this embodiment, each pixel thus has an anode terminal 12 of its own and a cathode terminal 11 of its own.

Figure 4:
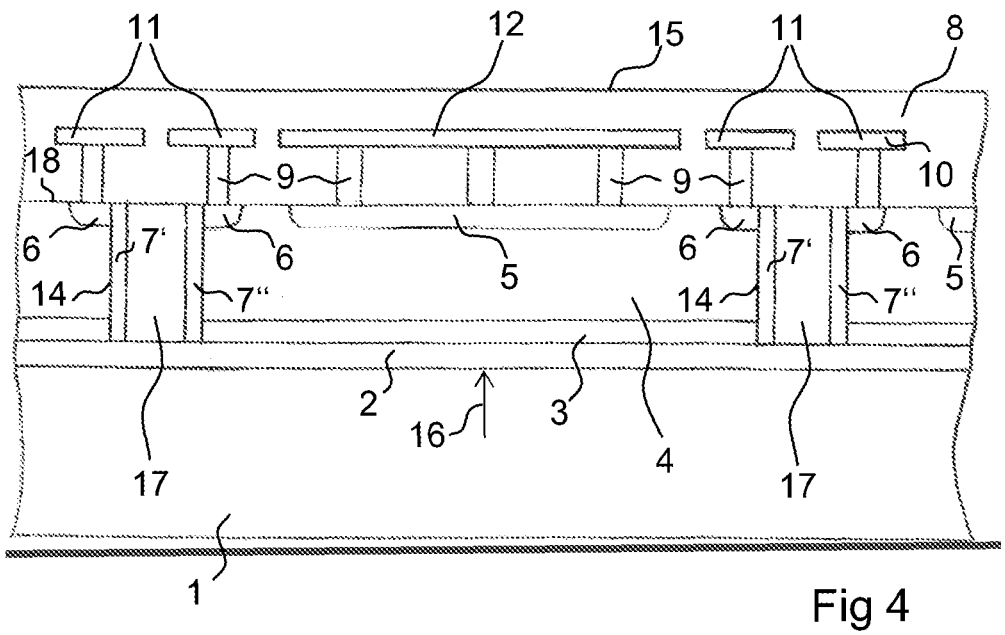
FIG. 4 shows a cross section according to FIG. 3 following an additional embodiment in which the trench subdivides the cathode layer.

FIG. 4 shows a cross section according to FIG. 2 through a further embodiment, in which the trench 14 subdivides the cathode layer 3 completely down to the insulation layer 2, and the conductor layer has portions 7', 7" that are separated from one another and have mutually separated cathode terminals 11. The contact area 6 is correspondingly subdivided. The trench 14 can be formed less deep than in FIG. 4, so that the trench 14 reaches into the cathode layer 3 without completely subdividing the cathode layer 3. In this embodiment as well, each pixel has an anode terminal 12 of its own and a cathode terminal 11 of its own.

Figure 5:
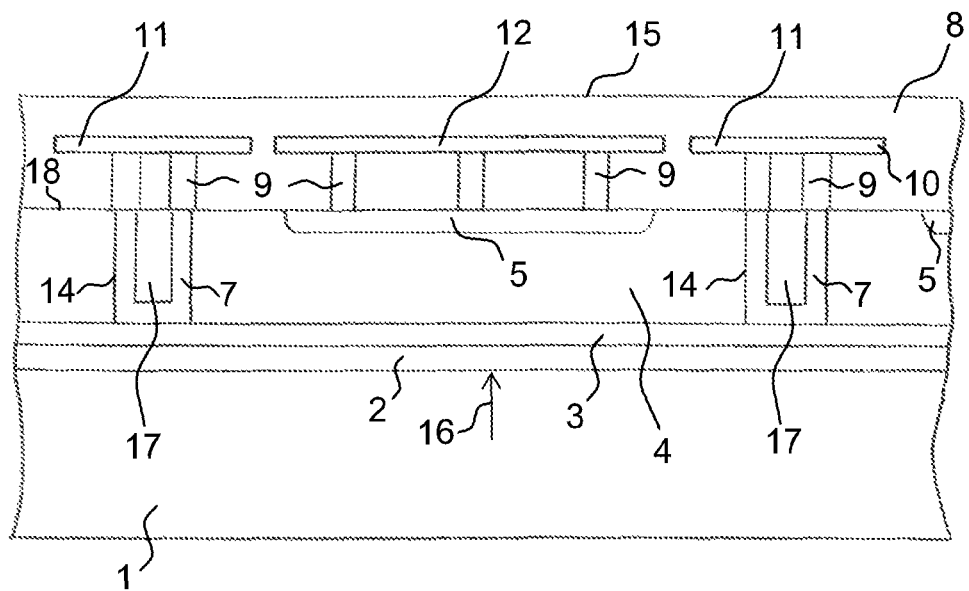
FIG. 5 shows a cross section according to FIG. 1 following an additional embodiment in which vertical conductors are applied directly to the conductor layer.

FIG. 5 shows a cross section according to FIG. 1 through a further embodiment, in which the contact area 6 was forgone, and the vertical conductors 9 are applied directly to the conductor layer 7.

Figure 6:
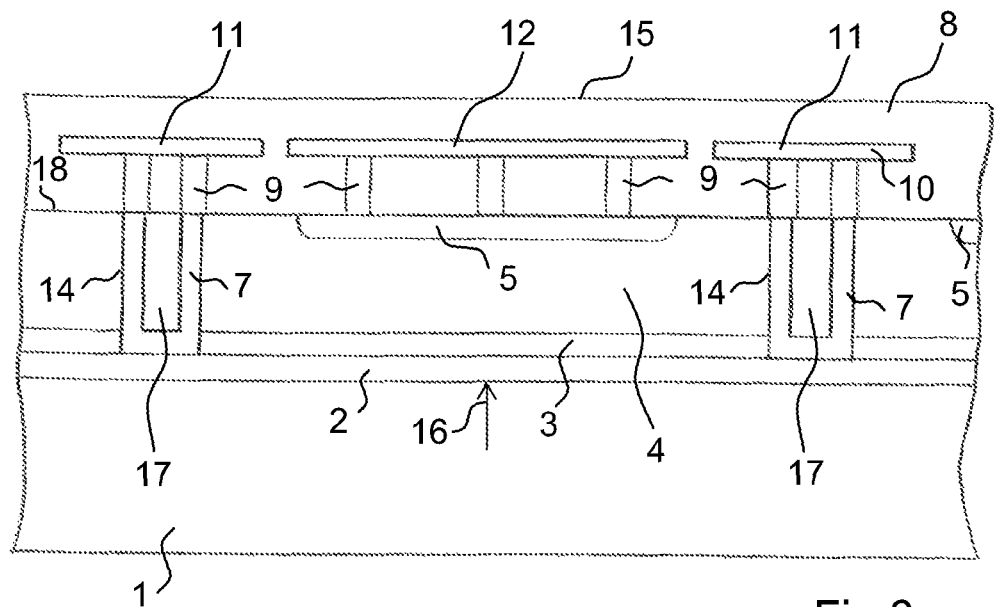
FIG. 6 shows a cross section according to FIG. 2 following an additional embodiment in which vertical conductors are applied directly to the conductor layer.

FIG. 6 shows a cross section according to FIG. 2 through a further embodiment, in which the contact area 6 was forgone, the vertical conductors 9 are applied directly to the conductor layer 7, and the trench 14 completely subdivides the cathode layer 3. In this example as well, the trench 14 can be formed less deep than in FIG. 5, so that the trench 14 reaches into the cathode layer 3 without completely subdividing the cathode layer 3.

Figure 7:
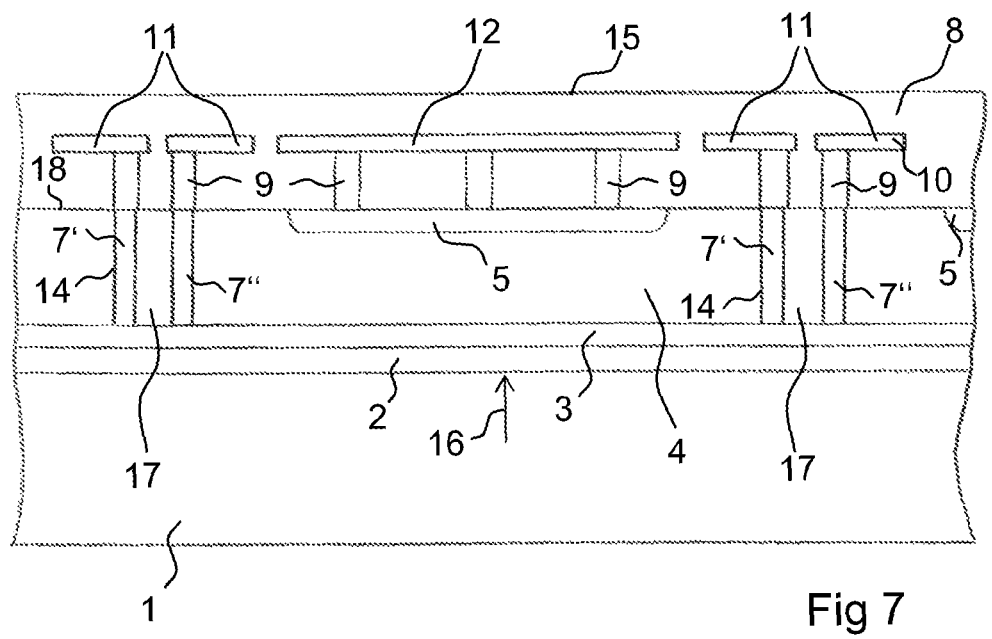
FIG. 7 shows a cross section according to FIG. 3 following an additional embodiment in which vertical conductors are applied directly to the conductor layer.

FIG. 7 shows a cross section according to FIG. 3 through a further embodiment, in which the contact area 6 was forgone, the vertical conductors 9 are applied directly to the conductor layer 7, and the conductor layer has portions 7', 7" that are separated from one another and are furnished with mutually separated cathode terminals 11.

Figure 8:
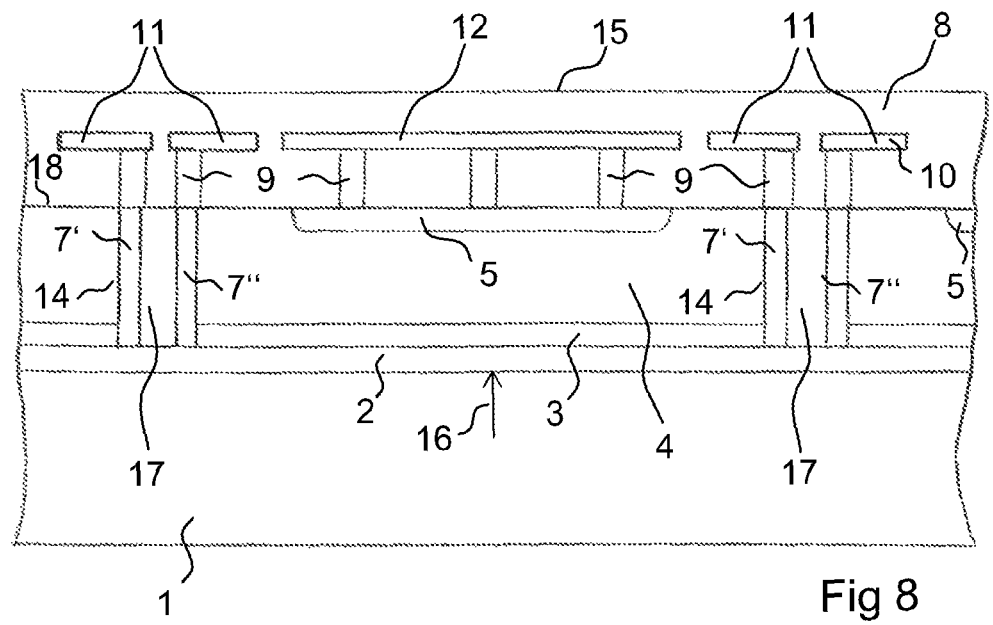
FIG. 8 shows a cross section according to FIG. 4 following an additional embodiment in which vertical conductors are applied directly to the conductor layer.

FIG. 8 shows a cross section according to FIG. 4 through a further embodiment, which differs from the embodiment according to FIG. 7 in that the trench 14 completely subdivides the cathode layer 3. In this example as well, the trench 14 can be formed less deep than in FIG. 8, so that the trench 14 reaches into the cathode layer 3 without completely subdividing the cathode layer 3.

Figure 9:
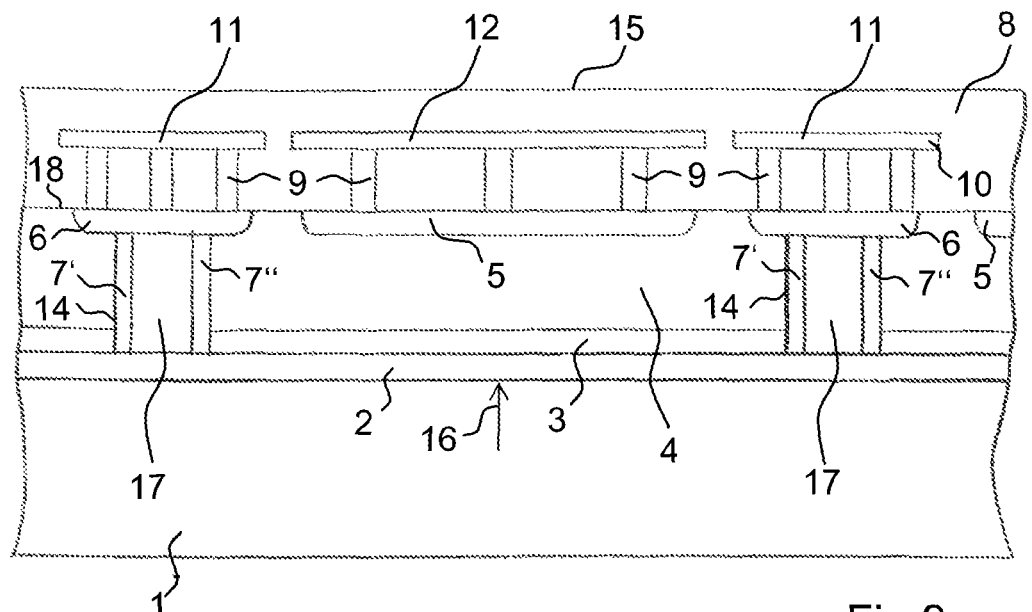
FIG. 9 shows a cross section according to FIG. 4 following an additional embodiment in which the trench is formed up to a contact area.

FIG. 9 shows a cross section according to FIG. 1 through a further embodiment, in which the same reference numbers as in FIG. 1 are used for the corresponding components. In this embodiment, the trench 14 is produced before the structure of the SOI substrate is produced, i.e. before the base substrate 1 is joined to the cathode layer 3. Thus the trench 14 is produced starting from the upper side of the photodiode layer 4 with the cathode layer 3. The photodiode layer 4 is preferably a layer component of a semiconductor wafer that has an initial thickness that is greater than that of the photodiode layer 4 of the finished photodiode device. After the trench 14 has been produced, the semiconductor wafer can be bonded on the side furnished with the cathode layer 3 to the substrate 1 by means of an insulation layer 2. For this purpose, the insulation layer 2 can preferably be applied to the cathode layer 3 or to the upper side of the base substrate 1 furnished for bonding. After the base substrate 1 has been bonded, the semiconductor wafer can be thinned from the side facing away from the cathode layer 3 until the trench 14 is exposed from this side and the upper side 18 of the photodiode layer 4 is formed. Instead of that, a residual layer portion of the photodiode layer 4, in which a contact area 6 is formed, can remain on top of the trench 14, as shown in FIG. 9. It is essential to produce a continuous electrically conductive connection between the cathode layer 3 and the cathode terminal 11, optionally the contact area 6, with which the crosstalk between the pixels is also suppressed. The conductor layer is present in this embodiment only on the side walls of the trench 14 in portions 7', 7", but can instead have a portion on the contact area 6 that connects the portions 7', 7" on the side walls. In this embodiment, the trench 14 subdivides the cathode layer 3. After production of the conductor layer 7, 7', 7" and optionally a trench filling 17, the base substrate 1 is attached to the cathode layer 3 by means of the insulation layer 2.

The conductor layer 7, or at least a part of the conductor layer 7, can be used in further process steps as a calibration mark (alignment mark). For this purpose, a special part of the trench 14 that is not necessary for subdivision of the photodiode array, but is instead used especially for forming an alignment mark, can be provided and furnished with a portion of the conductor layer 7.

The embodiment according to FIG. 9 has the advantage over the embodiment from FIG. 1 that fewer heat treatment steps are necessary after formation of the SOI substrate, and consequently less dopant diffuses out of the cathode layer 3 into the photodiode layer 4. The photodiode thus responds better, especially in the short wavelength range. The other advantages result in a similar manner as in the embodiment of FIG. 1.

Figure 10:
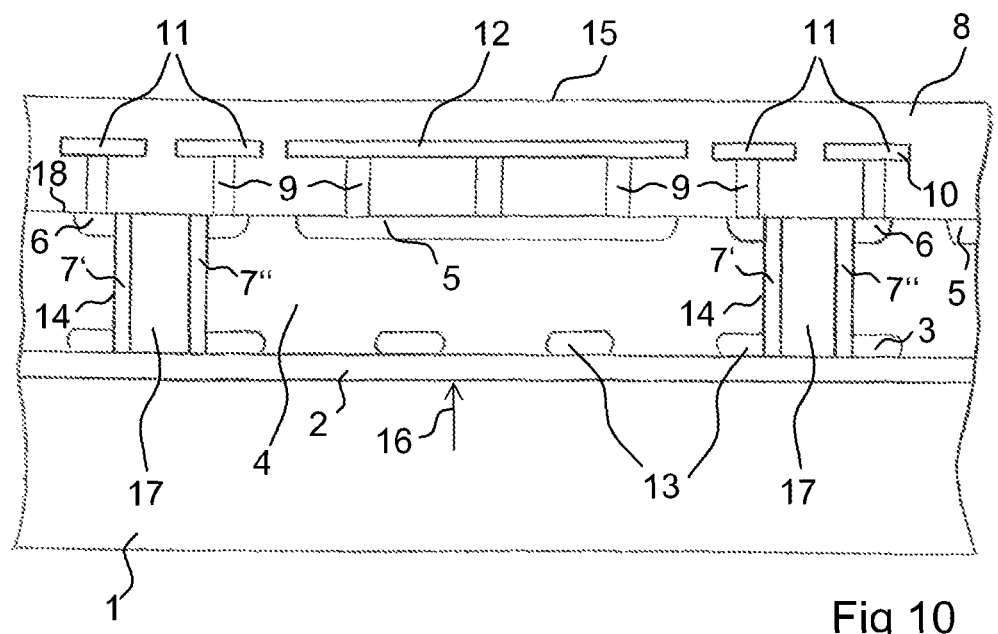
FIG. 10 shows a cross section according to FIG. 4 following an additional embodiment in which the cathode layer is subdivided into strip-like portions.

In the embodiment of FIG. 10, the cathode layer 3 is structured into several portions 13, in contrast to the embodiment of FIG. 4. These portions 13 can be strip-shaped, for example, and can run parallel to one another and be connected to one another via the conductor layer 7, 7', 7" and a portion of the cathode layer 3 running alongside the trench 14. In the illustrated example, the longitudinal direction of the strip-shaped portions 13 runs perpendicular to the drawing plane of FIG. 10. A better sensitivity of the photodiode in the range of wavelengths from typically roughly 350 nm to 500 nm is achieved with this finger-like structure of the cathode layer 3. The cathode layer 3 subdivided in this manner can also be correspondingly provided in the other embodiments described so far.

Figure 11:
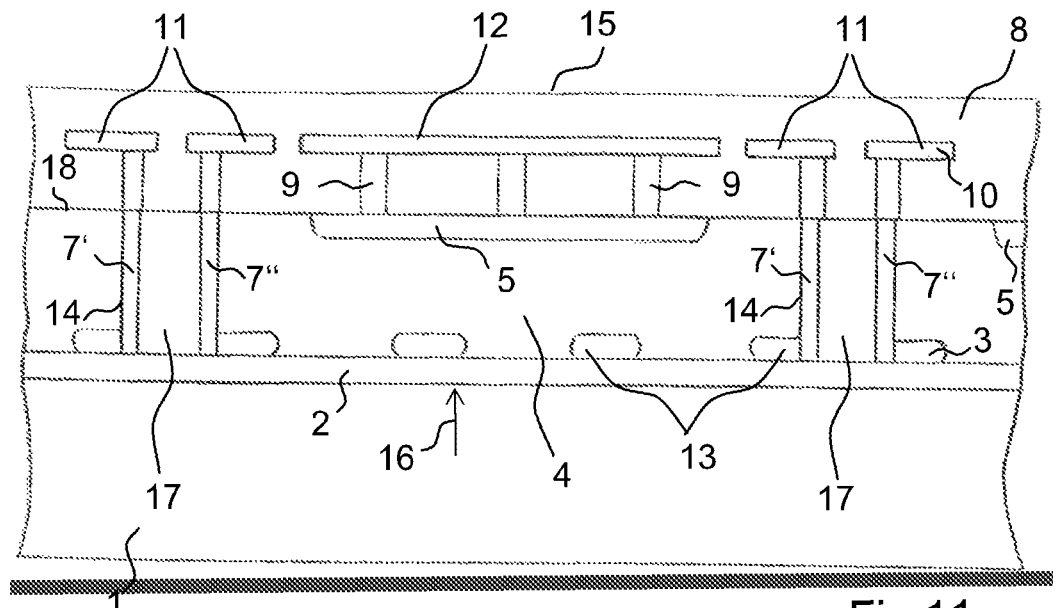
FIG. 11 shows a cross section according to FIG. 8 following an additional embodiment in which the cathode layer is subdivided into strip-like portions.

The embodiment of FIG. 11 corresponds to the embodiment of FIG. 8 with the difference that the cathode layer 3 is subdivided into several portions 13. The other embodiments can be correspondingly provided with a cathode layer 3 structured into several portions 13. The SOI structure can be produced before or after the production of the trench 14 by application of the base substrate 1 in the embodiments with a structured cathode layer 3 as well.

Figure 12:
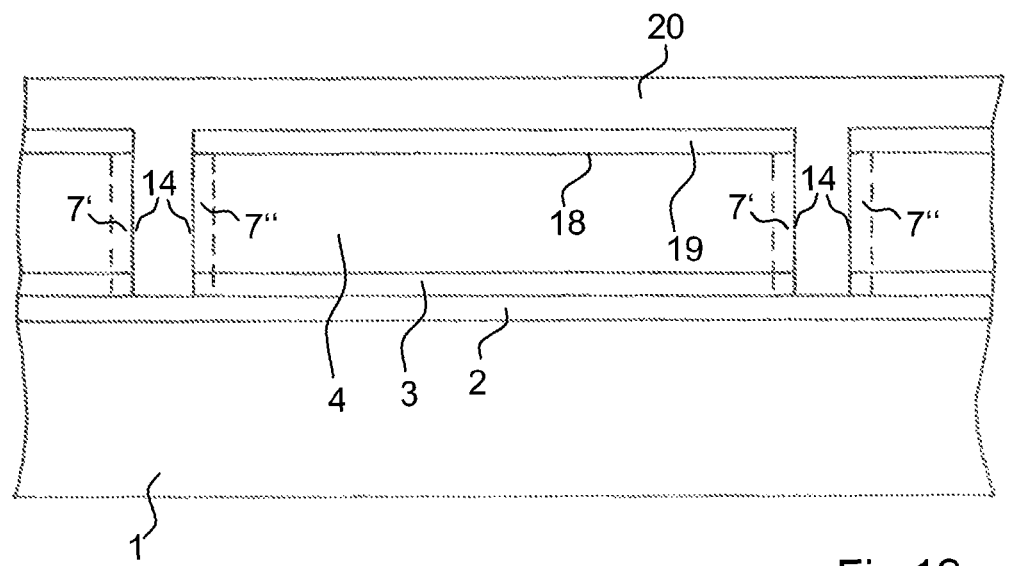
FIG. 12 shows a cross section through an intermediate product of a variant of the production method for the photodiode device.

As described, the conductor layer 7, 7', 7" can be applied as a layer or can instead be created as a doped region in the photodiode layer 4 on the side walls of the trench 14. FIG. 12 describes a cross section of an intermediate product for a production method suitable for the latter case. A diffusion barrier 19, which prevents the dopant from diffusing into the photodiode layer 4 in areas other than the trench walls, is preferably applied to the upper side 18 of the photodiode layer 4. If BPSG (borophosphate silicate glass) is used for applying the dopant, a barrier layer of SiN is particularly suitable as a diffusion barrier 19. After production of the trench 14, a dopant layer 20 is applied, which contains the dopant and fills the trench 14. BPSG is suitable as a dopant layer 20, for example, because phosphorus atoms in the silicon function as donors and a doped region formed therewith has n-type conductivity corresponding to the cathode layer 3. By a diffusion of the dopant atoms into the side walls of the trench 14, which can be stimulated thermally, for example, the portions 7', 7" of the conductor layer are formed as doped regions in the photodiode layer 4, which is indicated in the cross section of FIG. 12 by contours drawn in dashed lines. The dopant layer 20 and optionally the diffusion barrier 19 are subsequently removed. Then one of the embodiments, in particular according to FIG. 3, 4, 7, 8 or 11, is formed with the method steps already described. If the trench 14 is formed starting from the upper side of the photodiode layer 4 provided with the cathode layer 3 in the embodiment described with reference to FIG. 9, the dopant layer 20 can also be introduced into the trench 14 from this side of the photodiode layer 4. In this case as well, a diffusion barrier is previously applied as a layer to the cathode layer 3.

The subdivision of the photodiode array by means of the trench 14 and the conductor layer 7 markedly reduces the optical crosstalk between the individual pixels, wherein a reduction of the crosstalk by typically roughly two orders of magnitude can be expected. The low electrical resistance of the supply line to the cathode layer considerably improves the frequency behavior of the photodiode. The response time is reduced by typically two orders of magnitude in comparison to conventional photodiode components. The dark current of the photodiode component is reduced, because a guard ring subdividing the photodiode layer is not required and thus no Parasitic bipolar transistors occur.

LIST OF REFERENCE SIGNS

1 Base substrate
2 Insulation layer
3 Cathode layer
4 Photodiode layer
5 Anode region
6 Contact area
7 Conductive layer
7' Portion of the conductor layer
7" Portion of the conductor layer
8 Dielectric
9 Vertical conductor
10 Conductor plane
11 Cathode terminal
12 Anode terminal
13 Portion of the cathode layer
14 Trench
15 Bonding surface
16 Direction of light incidence
17 Trench filling
18 Upper side of the photodiode layer
19 Diffusion barrier
20 Dopant layer

The invention claimed is:

1. A photodiode device comprising:
an electrically conductive cathode layer on a photodiode layer made of a semiconductor material;
doped anode regions on an upper side of the photodiode layer facing away from the cathode layer;
a trench that subdivides the photodiode layer;
a conductor layer that is arranged in or on the trench and that electrically connects the cathode layer with a cathode terminal arranged above the upper side of the photodiode layer; and
anode terminals arranged above the upper side of the photodiode layer and electroconductively connected with the anode regions,
wherein a plurality of mutually separated cathode terminals are provided, and the conductor layer does not fill the trench and has a plurality of mutually separated portions, each connected to one of the respective cathode terminals.

2. The photodiode device according to claim 1, wherein the trench also subdivides the cathode layer.

3. The photodiode device according to claim 1, wherein a dielectric trench filling is present in the trench between the portions of the conductor layer.

4. The photodiode device according to claim 1, wherein the photodiode layer is float-zone silicon, and the anode regions are formed by a p+-type doping of the photodiode layer.

5. The photodiode device according to claim 1, wherein the cathode layer is subdivided into strip-shaped portions.

6. The photodiode device according to claim 1, wherein a doped contact area electrically connected with the conductor layer is present on the upper side of the photodiode layer, the cathode terminal and the anode terminals are formed in at least one conductor plane in a dielectric, and conductors, vertical relative to the conductor plane, connect the cathode terminal with the contact area and the anode terminals with the associated anode regions.

* * * * *